(12) United States Patent
Ho et al.

(10) Patent No.: US 6,962,850 B2
(45) Date of Patent: *Nov. 8, 2005

(54) PROCESS TO MANUFACTURE NONVOLATILE MOS MEMORY DEVICE

(75) Inventors: Vincent Ho, Singapore (SG); Wee Kiong Choi, Singapore (SG); Lap Chan, Singapore (SG); Wai Kin Chim, Singapore (SG); Vivian Ng, Singapore (SG); Cheng Lin Heng, Yangzhou (CN); Lee Wee Teo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 37 days.

This patent is subject to a terminal disclaimer.

(21) Appl. No.: 10/676,896

(22) Filed: Oct. 1, 2003

(65) Prior Publication Data

US 2005/0074939 A1    Apr. 7, 2005

(51) Int. Cl.$^7$ ............................................ H01L 21/336
(52) U.S. Cl. ...................................... 438/261; 438/962
(58) Field of Search ........................ 438/261, 264, 438/287, 591, 962

(56) References Cited

U.S. PATENT DOCUMENTS

| | | | |
|---|---|---|---|
| 5,783,498 A | 7/1998 | Dotta | 438/778 |
| 5,937,295 A * | 8/1999 | Chen et al. | 438/261 |
| 6,060,743 A | 5/2000 | Sugiyama et al. | 257/321 |
| 6,090,666 A | 7/2000 | Ueda et al. | 438/257 |
| 6,128,243 A | 10/2000 | Chan et al. | 365/227 |
| 6,165,842 A * | 12/2000 | Shin et al. | 438/962 |
| 6,656,792 B2 | 12/2003 | Choi et al. | 438/257 |
| 6,690,059 B1 * | 2/2004 | Lojek | 257/316 |

OTHER PUBLICATIONS

Ghandhi, "VLSI Fabrication Principles", 1983, pp. 420-424.*
Ya-Chin King et al., "MOS Memory Using Germanium Nanocrystals Formed by Thermal Oxidation of Si1-X Gex," IEDM Tech. Digest, 1998, pp. 115-118.
"A Silicon Nanocrystals Based Memory", Tiwari et al., Appl. Phys. Lett. 68(10), pp. 1377-1379, Mar. 4, 1996.

* cited by examiner

Primary Examiner—Chandra Chaudhari
(74) Attorney, Agent, or Firm—George O. Saile; Rosemary L. S. Pike; Stephen B. Ackerman

(57) ABSTRACT

Devices with embedded silicon or germanium nanocrystals, fabricated using ion implantation, exhibit superior data-retention characteristics relative to conventional floating-gate devices. However, the prior art use of ion implantation for their manufacture introduces several problems. These have been overcome by initial use of rapid thermal oxidation to grow a high quality layer of thin tunnel oxide. Chemical vapor deposition is then used to deposit a germanium doped oxide layer. A capping oxide is then deposited following which the structure is rapid thermally annealed to synthesize the germanium nanocrystals.

31 Claims, 2 Drawing Sheets

PROCESS TO MANUFACTURE NONVOLATILE MOS MEMORY DEVICE

FIELD OF THE INVENTION

The invention relates to the general field of microelectronics with particular reference to nonvolatile MOS devices, more specifically to their manufacture.

BACKGROUND OF THE INVENTION

In the upcoming age of nanotechnology, where devices may be a thousand times smaller than the microchips of today, semiconductor nanocrystals (Quantum Dots) have exhibited charge storage capability. This promises to be useful in future non-volatile memory applications and is currently under investigation by various research groups.

Charge storage devices that exceed the performance limits of a conventional floating-gate device have attracted a great deal of interest and are spurring rapid progress in this area. Quasi-nonvolatile MOS memory devices employing silicon nanocrystal charge-storage sites produced by ion implantation into the gate oxide have already been demonstrated (Tiwari et al., Appl. Phys. Lett. 68 (10), p.1377, 1996) or germanium (King et al. IEDM Tech. Dig., 1998, p. 115). Devices with embedded silicon or germanium nanocrystals, fabricated using ion implantation, exhibited superior data-retention characteristics as compared with conventional floating-gate devices. However, the ion implantation technique has its limitations such as a long processing time, a non-uniform germanium profile in the oxide and a compromise on the control oxide and interface quality. In addition, ion implantation places a lower limit on the top control-oxide thickness.

It has been suggested to use radio-frequency co-sputtering and rapid thermal annealing to form the oxide layer containing germanium nanocrystals (docket number CS01-074, Ser. No. 10/087,506, file date Mar. 1, 2002, now U.S. Pat. No. 6,656,792, assigned to a common assignee as the instant invention). A high quality layer of thin tunnel oxide is first grown by rapid thermal oxidation prior to the sputtering process. However, the subsequent sputtering step results in a non-stoichiometric oxide film and also has a problem with particle generation.

A routine search of the prior art was performed with the following references of interest being found:

In U.S. Pat. No. 6,128,243 Chan et al. show a memory for a SRAM using germanium Nanocrystals. U.S. Pat. No. 5,783,498 (Dotta) shows a process to form germanium Nanocrystals. Sugiyama et al. show a memory device using germanium Nanocrystals in U.S. Pat. No. 6,060,743 while, in U.S. Pat. No. 6,090,666, Ueda et al. show another memory device using germanium Nanocrystals.

SUMMARY OF THE INVENTION

It has been an object of at least one embodiment of the present invention to provide a process for manufacturing a non-volatile memory device.

Another object of at least one embodiment of the present invention has been that said device be of the MOS type.

Still another object of at least one embodiment of the present invention has been that the gate insulation of said device include germanium nanocrystals suspended in silicon oxide.

A further object of at least one embodiment of the present invention has been that formation of said gate insulation layer not require use of either RF sputtering or ion implantation.

These objects have been achieved by initial use of rapid thermal oxidation to grow a high quality layer of thin tunnel oxide. Chemical vapor deposition is then carried out to deposit a germanium doped oxide layer. A capping oxide is then deposited following which the structure is rapid thermally annealed to synthesize the germanium nanocrystals. The use of chemical vapor deposition process does not place a lower limit on the top control-oxide thickness. It also gives rise to better control oxide and interface quality as ion implantation damage is absent. In addition, the oxide in which the germanium nanocrystals are embedded is of better quality as compared to a sputtered oxide. This results in superior charge retention capability.

DESCRIPTION OF THE PREFERRED EMBODIMENTS

Overview: Rapid thermal oxidation is first used to grow a high quality layer of thin tunnel oxide. Chemical vapor deposition is then carried out to deposit a germanium doped oxide layer. A capping oxide is then deposited following which the structure is rapid thermally annealed to synthesize the germanium nanocrystals.

Figure 1:
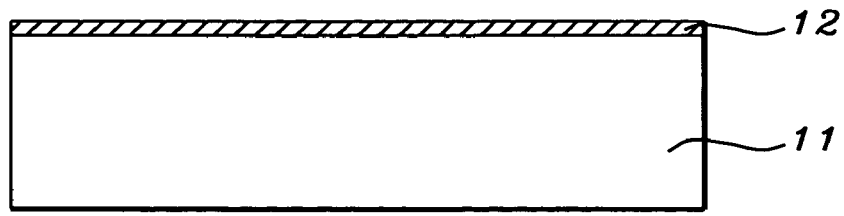
FIG. 1 shows formation of a layer of tunneling oxide on the surface of a silicon body.

Referring now to FIG. 1, the process of the present invention begins with the provision of silicon body 11. Body 11 is preferably P-type but this is not essential for the invention to work. Tunnel oxide layer 12 is then grown on the upper surface of 11. This was achieved by means of rapid thermal oxidation (at between about 900 and 1,000° C. for between about 5 and 60 seconds in a dry oxygen ambient), leading to an oxide thickness that is between about and 2 and 5 nm.

Figure 2:
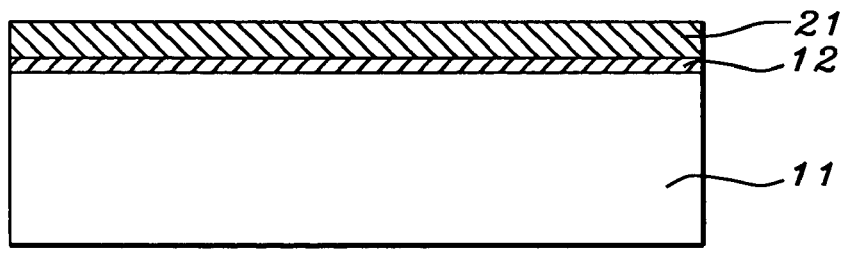
FIG. 2 shows formation of a germanium doped oxide layer on FIG. 1.

Next, as seen in FIG. 2, layer 21 of germanium doped silicon dioxide is deposited onto tunnel oxide layer 12. Layer 21 was formed by reacting silane in a mixture containing between about 5 and 30% germane and an oxygen source (such as ozone or nitrous oxide under conditions of low pressure chemical vapor deposition or plasma-enhanced chemical vapor deposition.

Figure 3:
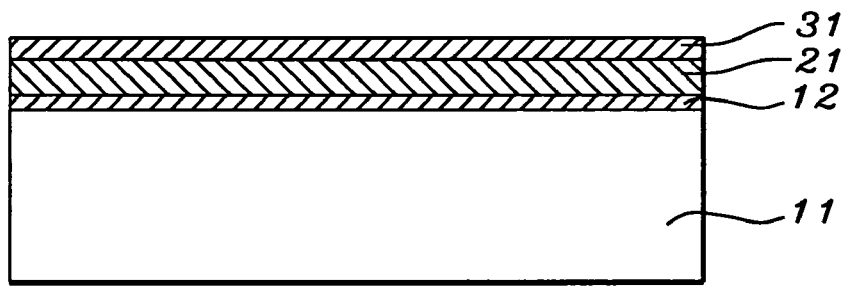
FIG. 3 shows deposition of the capping layer.
Figure 4:
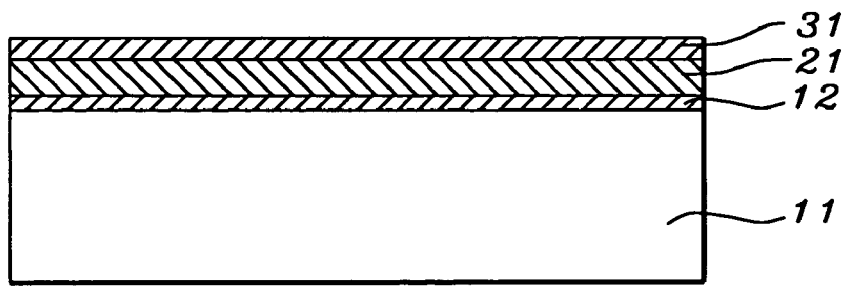
FIG. 4 illustrates the appearance of the Ge nanocrystals after RTA.

This is followed by the deposition of capping layer 31 (usually, but not necessarily, silicon oxide or silicon nitride) onto layer 21, as shown in FIG. 3. This layer is between about 10 and 50 nm thick and its deposition is achieved by using low pressure chemical vapor deposition or plasma-enhanced chemical vapor deposition.

Figure 5:
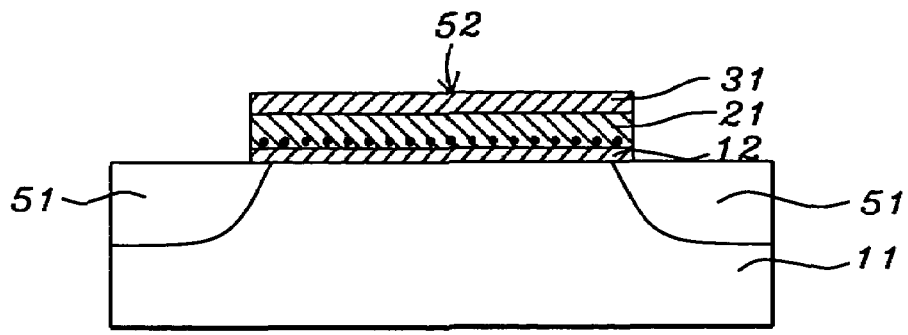
FIG. 5 illustrates a finished device.

At this point, formation of the charge retaining portion of the structure has been completed except for the formation of the germanium nanocrystals (see below). To complete formation of the nonvolatile memory structure, layers 12, 21, and 31 are patterned to form gate pedestal 52 as shown in FIG. 5. Then, using this gate pedestal as a mask, source and drain regions 51 that abut it (and extend downwards from it) are formed by ion implantation or by diffusing suitable dopant material through a hard mask. If the preferred version of P-type was used for the silicon body 11, then regions 51 will necessarily be N-type. Using conventional methods, electrical contacts to the source and drain regions and to the gate pedestal are made.

The final process step (after source and drain regions have been formed) is to subject the device to a rapid thermal anneal (between about 800 and 1,000° C. for up to 300 seconds) in a non reactive gas such as argon or nitrogen. This precipitates some of the germanium out of solution in the form of nanocrystals having a mean diameter between about 2 and 10 nm, such as 41 in FIG. 5. Additionally, this annealing step serves to repair ion implantation damage as well as to activate dopant sites in the source and drain regions.

Figure 6:
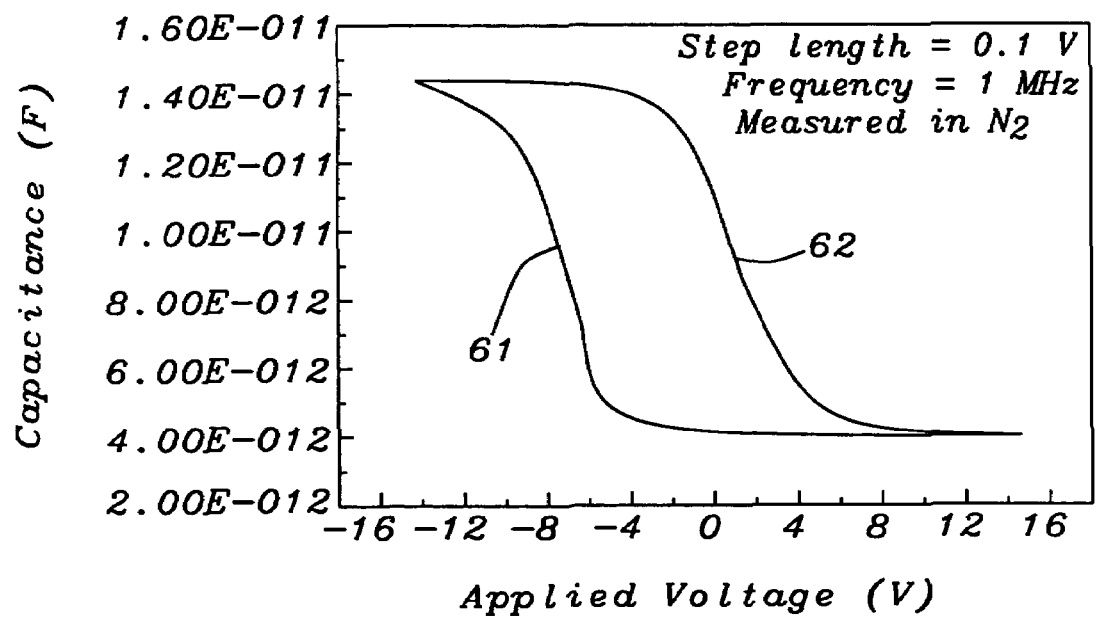
FIG. 6 is a C-V curve for a gate insulation layer of the type used in the present invention.

FIG. 6 is an example of a capacitance vs. voltage (C-V) curve for a device for a device having a similar structure to that described above (germanium nanocrystals embedded in an amorphous oxide) but with the germanium and capping oxide layers fabricated using sputtering (as in docket number CS01-074, Ser. No. 10/087,506, file date Mar. 1, 2002, now U.S. Pat. No. 6,656,792, assigned to a common assignee as the instant invention). The counter-clockwise hysteresis seen in the C-V curve reflects the ability of the device to store charge.

When the applied voltage on the capacitor structure is increased from −15 to +15 volts, in steps of 0.5 volts, the capacitance follows curve 61 as the P-doped silicon at the silicon-oxide interface is driven from accumulation to inversion. When the silicon is in inversion, electrons will be injected into the gate oxide and subsequently be trapped at defect sites in, or at, the surface of the germanium nanocrystals. Consequently, as the applied voltage is swept, from +15 to −15 volts, in steps of 0.5 volts, the capacitance follows curve 62, resulting in a positive flatband voltage shift due to the electrons trapped by the Ge nanocrystals. Hence a counter-clockwise hysteresis is observed in the C-V characteristics.

What is claimed is:

1. A process to manufacture a non-volatile memory structure, comprising:
   providing a silicon body having an upper surface;
   forming source and drain regions using ion implant:
   growing a tunnel oxide layer on said upper surface;
   depositing a layer of germanium doped silicon dioxide onto said tunnel oxide layer;
   depositing a capping layer onto said layer of germanium doped silicon dioxide; and
   rapid thermally annealing the structure whereby germanium nanocrystals are formed in said germanium doped silicon dioxide layer, ion implant damage is repaired, and source and drain region dopants are activated.

2. The process described in claim 1 wherein said silicon body is P-type tunnel.

3. The process described in claim 1 wherein the step of growing said oxide layer further comprises rapid thermal oxidation in a dry oxygen ambient.

4. The process described in claim 3 wherein the step of rapid thermal oxidation is heating at between about 900 and 1,000° C. for between about 5 and 60 seconds.

5. The process described in claim 1 wherein said tunnel oxide layer is grown to a thickness that is between about 2 and 5 nm.

6. The process described in claim 1 wherein the step of depositing a layer of germanium doped silicon dioxide further comprises using low pressure chemical vapor deposition or plasma-enhanced chemical vapor deposition.

7. The process described in claim 1 wherein the step of depositing a layer of germanium doped silicon dioxide further comprises reacting silane in a mixture containing between about 5 and 30% germane and an oxygen source.

8. The process described in claim 7 wherein said oxygen source is ozone or nitrous oxide.

9. The process described in claim 1 wherein the step of depositing a capping layer onto said layer of germanium doped silicon dioxide further comprises using low pressure chemical vapor deposition or plasma-enhanced chemical vapor deposition.

10. The process described in claim 1 wherein said capping layer is silicon oxide or silicon nitride.

11. The process described in claim 1 wherein said capping layer is deposited to a thickness between about 10 and 50 nm.

12. The process described in claim 1 wherein the step of rapid thermally annealing the structure further comprises heating at a temperature between about 800° C. and 1,000° C. for up to 300 seconds in a non reactive gas.

13. The process described in claim 12 wherein said non reactive gas is argon or nitrogen.

14. The process described in claim 1 wherein said nanocrystals have a mean diameter between about 2 and 10 nm.

15. A process to manufacture a non-volatile MOS based memory device comprising:
   providing a silicon body having an upper surface;
   growing a tunnel oxide layer on said upper surface;
   depositing a layer of germanium doped silicon dioxide onto said tunnel oxide layer;
   depositing a capping layer onto said layer of germanium doped silicon dioxide;
   patterning said tunnel oxide, germanium doped silicon dioxide, and capping layers to form a gate pedestal;
   using said gate pedestal as a mask, forming source and drain regions that abut said gate pedestal at said upper surface and extend downwards therefrom into said silicon body; and
   rapid thermally annealing the device whereby germanium nanocrystals are formed in said germanium doped silicon dioxide layer, thereby forming said non-volatile memory device.

16. The process described in claim 15 wherein said silicon body is P-type.

17. The process described in claim 15 wherein the step of growing said tunnel oxide layer further comprises rapid thermal oxidation in a dry oxygen ambient.

18. The process described in claim 17 wherein the step of rapid thermal oxidation is heating at between about 900 and 1,000° C. for between about 5 and 60 seconds.

19. The process described in claim 15 wherein said tunnel oxide layer is grown to a thickness that is between about 2 and 5 nm.

20. The process described in claim 15 wherein the step of depositing a layer of germanium doped silicon dioxide further comprises using low pressure chemical vapor deposition or plasma-enhanced chemical vapor deposition.

21. The process described in claim 15 wherein the step of depositing a layer of germanium doped silicon dioxide further comprises reacting silane in a mixture containing between about 5 and 30% germane and an oxygen source.

22. The process described in claim 21 wherein said oxygen source is ozone or nitrous oxide.

23. The process described in claim 15 wherein the step of depositing a capping layer onto said layer of germanium doped silicon dioxide further comprises using low pressure chemical vapor deposition or plasma-enhanced chemical vapor deposition.

24. The process described in claim 15 wherein the step of rapid thermally annealing the structure further comprises heating at a temperature between about 800° C. and 1,000° C. for up to 300 seconds in a non reactive gas.

25. The process described in claim 24 wherein said nonreactive gas is argon or nitrogen.

26. The process described in claim 15 wherein said nanocrystals have a mean diameter between about 2 and 10 nm.

27. The process described in claim 15 wherein said source and drain regions are N-type.

28. The process described in claim 15 wherein the step of forming source and drain regions further comprises diffusion through a hard mask.

29. The process described in claim 15 wherein the step of forming source and drain regions further comprises using ion implantation.

30. The process described in claim 15 further comprising formation of electrical contacts to said source and drain regions and to said gate pedestal.

31. The process described in claim 29 wherein the step of rapid thermally annealing the structure serves, additionally, to repair ion implant damage and to activate source and drain regions.

* * * * *